United States Patent [19]

Seckora

[11] Patent Number: 5,014,059

[45] Date of Patent: * May 7, 1991

[54] ANALOG-TO-DIGITAL CONVERTER SYSTEM

[75] Inventor: Michael C. Seckora, Gervais, Oreg.

[73] Assignee: Tektronix, Inc., Beaverton, Oreg.

[*] Notice: The portion of the term of this patent subsequent to Mar. 6, 2007 has been disclaimed.

[21] Appl. No.: 488,185

[22] Filed: Mar. 1, 1990

Related U.S. Application Data

[63] Continuation of Ser. No. 206,975, Jun. 13, 1988, Pat. No. 4,906,997, which is a continuation of Ser. No. 77,952, Jul. 28, 1987, abandoned, which is a continuation of Ser. No. 733,000, May 13, 1985, abandoned.

[51] Int. Cl.$^5$ .............................................. G11C 19/28
[52] U.S. Cl. ..................................... 341/172; 341/150
[58] Field of Search ............... 341/133, 136, 144, 150, 341/155, 159, 172; 377/57, 60, 63

[56] References Cited

U.S. PATENT DOCUMENTS

| | | | |
|---|---|---|---|
| 3,763,480 | 10/1973 | Weimer | 365/238 |
| 3,820,112 | 6/1974 | Roth | 341/899 |
| 3,958,210 | 5/1976 | Levine | 365/183 |
| 4,099,175 | 7/1978 | Rubin | 341/150 |
| 4,329,679 | 5/1982 | Jensen | 341/172 |
| 4,353,057 | 10/1982 | Bernet et al. | 341/172 |
| 4,458,324 | 7/1984 | Burke et al. | 341/172 |
| 4,464,726 | 8/1984 | Chiang | 341/172 |
| 4,471,341 | 9/1984 | Sauer | 341/172 |

Primary Examiner—William M. Shoop, Jr.
Assistant Examiner—H. L. Williams
Attorney, Agent, or Firm—Francis I. Gray; Paul S. Angello

[57] ABSTRACT

A serial-to-parallel analog CCD GaAs device provides high speed A/D or D/A conversion. A high speed analog signal is sampled by shifting the analog data serially into "n" CCD elements. Then a parallel load pulse transfers the analog data into multiple CCD holding elements. A bank of A/D converters converts the analog data. Conversely, the outputs of a bank of D/A converters are loaded in parallel into a serial CCD device of "n" elements. The serial CCD device is shifted out serially to complete the conversion to an analog signal.

10 Claims, 4 Drawing Sheets

ANALOG-TO-DIGITAL CONVERTER SYSTEM

This is a continuation of application No. 07/206,975, filed on June 13, 1988, and issued as U.S. Pat. No. 4,906,997 on Mar. 6, 1990, which is a continuation of application No. 07/077,952, filed on July 28, 1987, now abandoned, which is a continuation of application No. 06/733,000, filed May 13, 1985, now abandoned.

BACKGROUND OF THE INVENTION

1. Field of the Invention

The present invention relates to analog conversion devices, and more particularly to a serial-to-parallel analog charge coupled device (CCD) gallium arsenide (GaAs) device for analog-to-digital or digital-to-analog high speed conversion.

2. Description of the Prior Art

High speed analog conversion is desired for high performance instrumentation. Gallium arsenide (GaAs) converters have the capability of high speed operation. Such converters, however, have an aperture window, or delay, which varies from converter to converter. These converters have been cascaded to convert analog signals to digital data by limiting each converter to an amplitude range with the analog signal input to each one simultaneously. When a convert signal is applied to the converters, only that converter whose amplitude range encompasses the amplitude of the analog signal at that instant provides an output. Due to the differences between converters, the outputs from different converters may occur at different times after the convert signal, resulting in inaccuracies, or glitches, when the data are recreated.

A non-realtime technique uses charge coupled devices which are sample and hold storage devices. Data are read rapidly into the CCDs, then during a pause in the data, the data are read out for conversion before the CCDs lose a significant part of their charge.

What is desired is a realtime analog conversion device which operates at high speed without data glitches in the time domain.

SUMMARY OF THE INVENTION

Accordingly, the present invention provides a serial-to-parallel analog CCD GaAs device for use in analog-to-digital or digital-to-analog high speed conversion. A high speed analog signal is sampled by shifting the analog data serially into "n" CCD elements. Then a parallel load pulse transfers the discrete analog data into multiple CCD holding elements. A bank of A/D converters converts the format of the analog data into digital form. Conversely, the outputs of a bank of D/A converters ar loaded in parallel into a serial CCD device of "n" elements. The serial CCD device is shifted out serially to complete the conversion to an analog signal.

The objects, advantages and novel features of the present invention will be apparent from the following detailed description when read in conjunction with the appended claims and attached drawings.

DESCRIPTION OF THE PREFERRED EMBODIMENT

Figure 1:
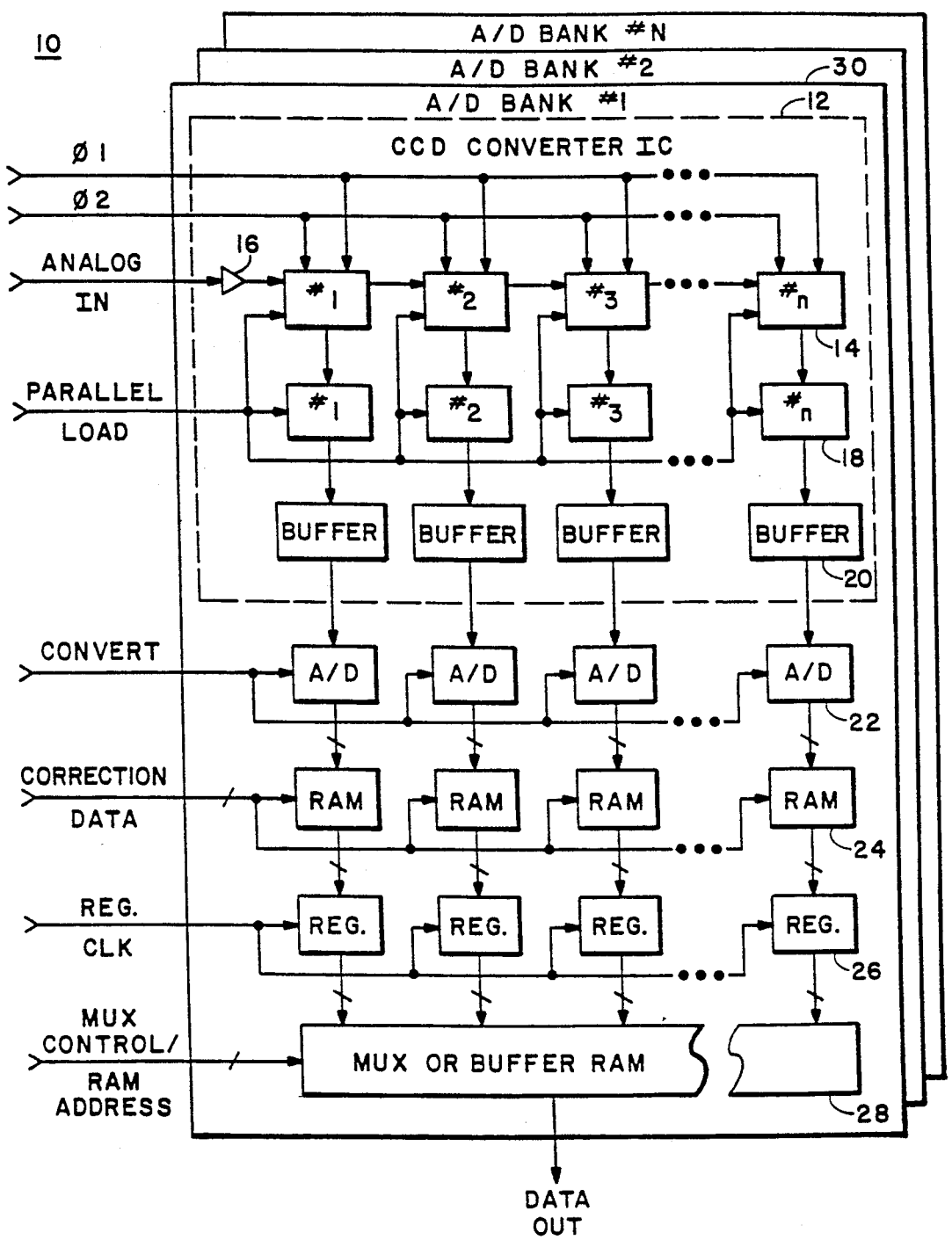
FIG. 1 is a block diagrammatic view of a serial-to-parallel analog CCD GaAs device for converting analog data to digital data according to the present invention.
Figure 3:
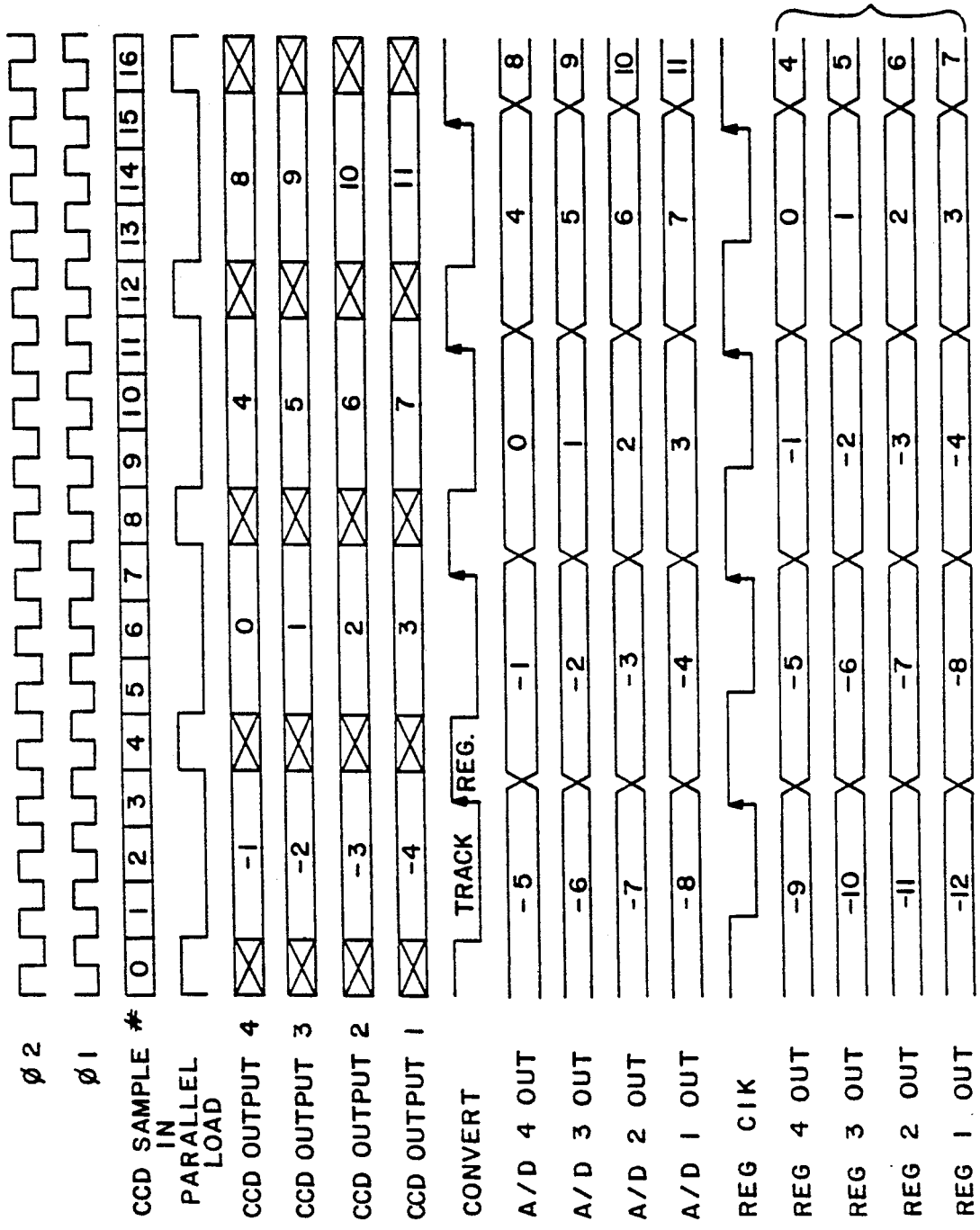
FIG. 3 is a timing diagram for the A/D converter of FIG. 1 with four elements.

Referring to FIGS. 1 and 3, an analog-to-digital converter 10 is shown. A charge-coupled device (CCD) converter integrated circuit (IC) 12 has a first plurality of serial CCD elements 14, 1 through n. A high speed analog signal, ANALOG IN, is continuously input to the first CCD elements 14 via a buffer amplifier 16. CCD clock pulses, 1 and 2 form sets of pulses which shift the analog signal along the first CCD elements 14 at a high rate. When the first CCD elements 14 are full and one sequence of pulse is complete, a PARALLEL LOAD signal transfers the analog data in discrete form from the first CCD elements 14 into a second plurality of analog parallel CCD elements 18, 1 through n. The second CCD elements 18 act as a save and hold register for the subsequent conversion. A plurality of CCD buffers 20, one for each of the second CCD elements 18, completes the CCD converter IC 12 and serves to isolate the second CCD elements 18 from external disturbances.

A plurality of analog-to-digital devices 22 convert the formats of the discrete analog data from the second CCD elements 18 via the CCD buffers 20 to digital data in parallel. Each datum of the digital data represents a digital weighted value of a discrete analog datum held by one of the second CCD elements. The digital data are transferred to a plurality of optional correction RAMs 24 to adjust for matching errors in the second CCD elements 18. The data are subsequently stored in a plurality of registers 26, and then transferred to a multiplexer (MUX) or buffer RAM 28. The converted data, DATA OUT are then output from the multiplexer or buffer RAM 28.

One bank 30 of "n" A/D converters 22 can do the conversion if the parallel transfer from the first CCD elements 14 to the second CCD elements 18 can be done in one CCD clock time. The A/D convert time is n times the CCD clock time. The CCD buffer 20 to A/D 22 drive time is (n−1) times the CCD clock time. For example, if a CCD device has ten elements and uses ten eight-bit 100MHz A/D converters, a 1.0 ns convert time, or a 1.0 GHz eight-bit conversion, can be made.

However, if the parallel load time requires more than one CCD clock time to shift from the first CCD elements 14 to the second CCD elements 18, then N banks 30 of A/D converters and CCD elements may be arranged as shown. The A/D convert time is n(N) times the CCD clock time. The CCD buffer 20 to A/D 22 drive time is n(N) less the parallel loadtime. The maximum available parallel loadtime is n(N−1) times the CCD clock time. For example, if n=4 and N=4, then for sixteen 100MHz eight-bit A/D converters 22, a 0.625 ns convert time or a 1.6 GHz eight-bit conversion with up to 7.5 ns parallel loadtime can be made.

The correction RAM 24 is written to compensate for matching errors in the second CCD elements 18, CCD buffers 20 and the A/D converters 22. This is done by sending a test signal, created by a D/A converter from a known signal stored in a PROM, and comparing the DATA OUT with the PROM known signal data. Adjustments to the correction RAMS 24 are made until proper amplitude and linearity are obtained.

Figure 2:
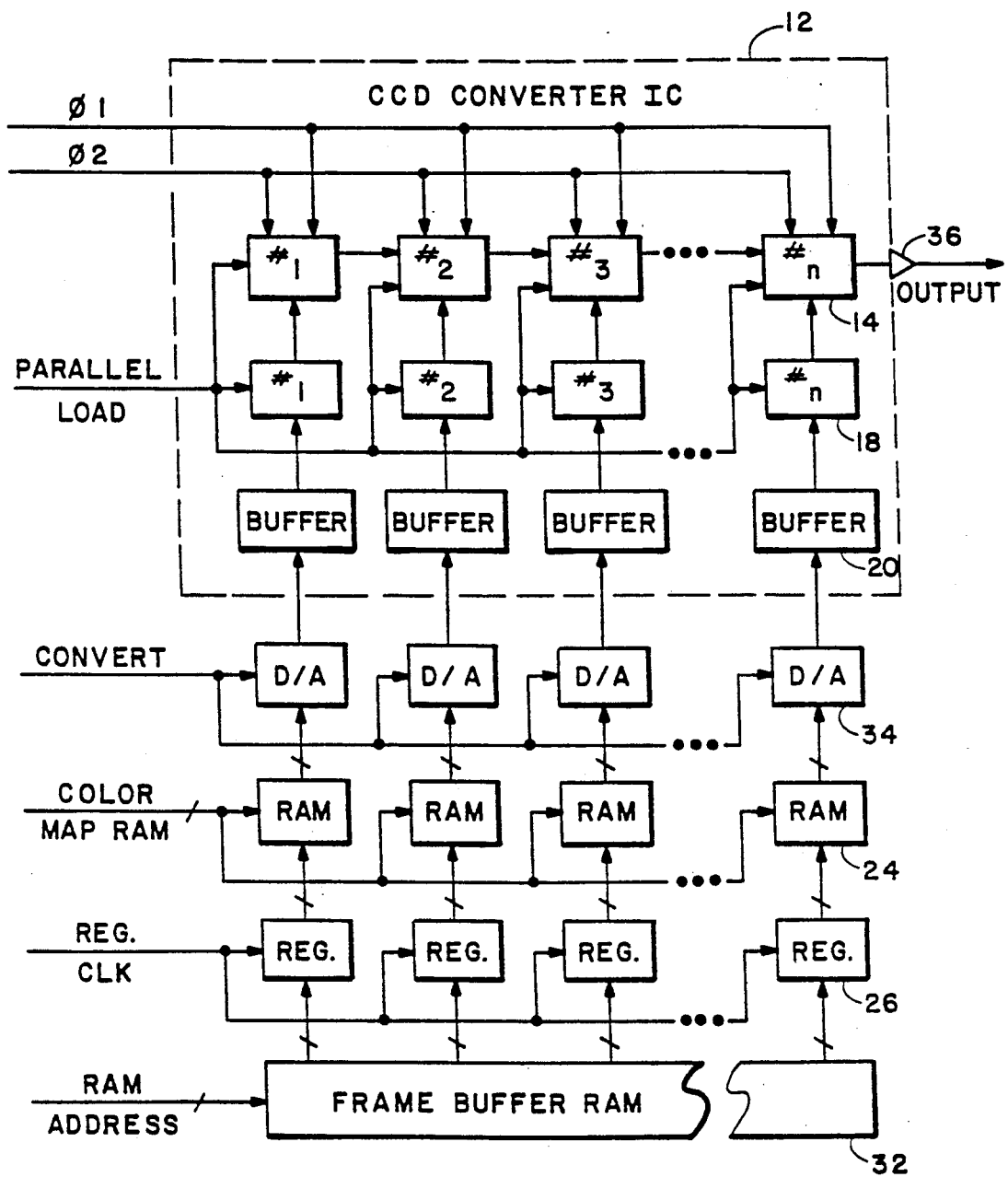
FIG. 2 is a block diagrammatic view of a parallel-to-serial analog CCD GaAs device for converting digital data to analog data according to the present invention.
Figure 4:
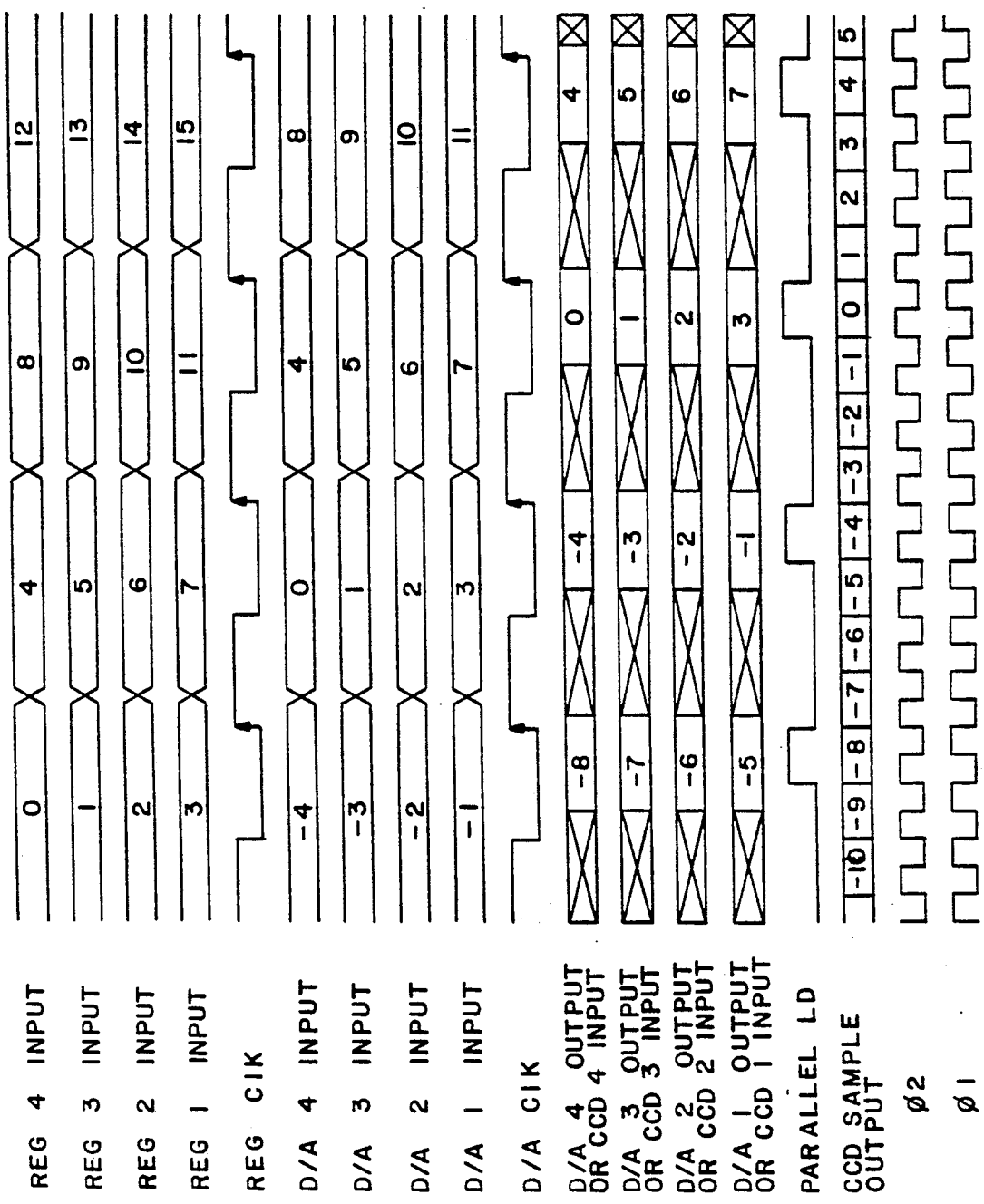
FIG. 4 is a timing diagram for the D/A converter of FIG. 2 with four elements.

The reverse digital-to-analog conversion can be achieved as shown in FIGS. 2 and 4. Digital data from a frame buffer RAM 32 are loaded into the registers 26 and corrected by the correction RAMS 24. Then a plurality of digital-to-analog (D/A) converters 34 convert format of the digital values from the correction RAMS 24 into analog values The output of the D/A converters 34 is loaded into the second CCD elements 18 via the CCD buffers 20, and then parallel loaded into the first CCD elements 14. The values in the first CCD elements 14 are continuously shifted out through a buffer amplifier 36 to provide an analog or video output to a display. The speed of this D/A conversion is n times the D/A conversion rate, or (D/A convert time) divided by n is the CCD output convert time. For example, ten 125 MHz eight-bit D/A converters can convert at 1.25 GHz. This type of D/A conversion speed is required for large, high resolution graphic displays such as 4 k by 4 k pixel displays.

Thus, the present invention provides high speed D/A and A/D converters using a CCD device.

What is claimed is:

1. An analog-to-digital conversion system including a storage device adapted for converting signal formats, comprising:
   a plurality of first storage elements connected together to form a first linear array and operative for receiving an analog signal and continually shifting the analog signal along the array in accordance with sequences of clock pulses;
   a plurality of second storage elements arranged in a second linear array and operative for holding discrete analog data transferred in parallel at end of each sequence of clock pulses from the first storage elements, the second storage elements having parallel output conductors and each of the second storage elements providing on its output conductor a discrete analog datum not held by any other of the second storage elements; and
   a plurality of multiple bit analog-to-digital converters each one of which is coupled to a different one of said parallel outputs of the second storage elements and which are operative for concurrently converting the discrete analog data into digital data, each datum of the digital data representing a multiple bit digital weighted value of a discrete analog datum held by one of the second storage elements.

2. The system of claim 1, further including:
   a plurality of buffer means one of which is coupled between each of the second storage elements and the analog-to-digital converter to which it is coupled for isolating the second storage elements from external disturbances; and
   amplifier means coupled between the array of first storage elements and the conductor for buffering the storage elements with respect to the analog signal.

3. The system of claim 1, further including a plurality of correction means one of which is coupled to each of the analog-to-digital converters for adjusting the data passing through each of the converters in order to compensate for errors in the operation of the system.

4. The system of claim 1, in which the first and second storage elements are of the sample and hold type.

5. The system of claim 4, in which the first and second storage elements comprise charge-coupled devices.

6. In an apparatus including a storage device having an array of rows and columns, a process comprising the steps of:
   continuously shifting an analog signal across one row of the array along a first set of storage elements;
   periodically loading discrete analog data signals representing samples of the analog signal in parallel down a set of columns in the array from the first set of storage elements into a second set of storage elements for holding said discrete analog data signals, each one of the second set of storage elements having a parallel output conductor;
   transmitting the discrete analog data signals in parallel from the parallel output conductors of the second set of storage elements to a set of multiple bit A/D converters, each storage element in the second set providing on its output conductor a discrete analog data signal not held by any other of the second storage elements; and
   converting the discrete analog data signals into digital data through the use of the A/D converters, each datum of the digital data representing a multiple bit digital weighted value of a discrete analog datum signal held by one storage element in the second set.

7. The process of claim 6, further including the steps of:
   adjusting the digital data to compensate for errors in the shifting, loading, transmitting, and converting steps.

8. The method of claim 6, further including the step of buffering the discrete analog data signals from the second set of storage elements to the set of A/D converters.

9. The process of claim 6, in which the first and second sets of storage elements are of the sample and hold type.

10. The process of claim 9, in which the first and second sets of storage elements comprise charge-coupled devices.

* * * * *